(12) United States Patent
Lai

(10) Patent No.: US 9,225,304 B1
(45) Date of Patent: Dec. 29, 2015

(54) SINGLE-STAGE FOLDED CASCODE BUFFER AMPLIFIERS WITH ANALOG COMPARATORS

(71) Applicant: SanDisk 3D LLC, Milpitas, CA (US)

(72) Inventor: Vincent Lai, Gilroy, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/522,678

(22) Filed: Oct. 24, 2014

(51) Int. Cl.
*H03F 3/45* (2006.01)
*H03F 1/30* (2006.01)

(52) U.S. Cl.
CPC .............. *H03F 3/45076* (2013.01); *H03F 1/30* (2013.01); *H03F 2200/78* (2013.01); *H03F 2203/45116* (2013.01)

(58) Field of Classification Search
USPC .......................................... 330/260, 255, 253
IPC ............................................................ H03F 3/45
See application file for complete search history.

(56) References Cited

U.S. PATENT DOCUMENTS

| | | | | |
|---|---|---|---|---|
| 5,334,948 A * | 8/1994 | Fong | .................... | H03F 3/45183 330/253 |
| 6,525,589 B1 * | 2/2003 | Thomsen | ................ | G01D 3/022 327/336 |
| 6,617,883 B1 * | 9/2003 | Kuhn | .................... | G01R 25/005 327/12 |
| 7,564,308 B1 * | 7/2009 | Vats | ..................... | H03F 3/45121 330/255 |
| 2007/0159250 A1 * | 7/2007 | Tsuchi | ................. | H03F 3/45233 330/253 |
| 2008/0180174 A1 * | 7/2008 | Kim | ......................... | H03F 1/083 330/253 |
| 2008/0272844 A1 * | 11/2008 | Rayanakorn | ............ | H03F 1/483 330/253 |

OTHER PUBLICATIONS

Chandel et al., "Slew-Rate Enhancement Circuit for Single—Stage Folded—Cascode Amplifiers", International Journal of Advanced Engineering Technology, vol. I, Issue II, Jul.-Sep. 2010.

* cited by examiner

*Primary Examiner* — Patricia T Nguyen
(74) *Attorney, Agent, or Firm* — Vierra Magen Marcus LLP

(57) ABSTRACT

A single-stage folded cascode buffer including an amplifier, a first analog comparator, a second analog comparator, a first transistor, and a second transistor, The amplifier includes a first input terminal, a second input terminal, and an output terminal coupled to the second input terminal of the amplifier. The first analog comparator includes a first input terminal, a second input terminal, and an output terminal. The second analog comparator includes a first input terminal, a second input terminal, and an output terminal. The first transistor includes a first terminal, a second terminal coupled to the output terminal of the first analog comparator, and a third terminal coupled to the output terminal of the amplifier. The second transistor includes a first terminal coupled to the output terminal of the amplifier, a second terminal coupled to the output terminal of the second analog comparator, and a third terminal.

28 Claims, 4 Drawing Sheets

SINGLE-STAGE FOLDED CASCODE BUFFER AMPLIFIERS WITH ANALOG COMPARATORS

BACKGROUND

The present disclosure relates to single-stage folded cascode buffer amplifiers with analog comparators. The disclosed technology may be used in a variety of circuits, including buffer amplifiers for non-volatile memory arrays.

DETAILED DESCRIPTION

Technology is described for single-stage folded-cascode. In particular, technology is described for single-stage folded-cascode buffers that include an amplifier, first and second analog comparators and first and second transistors. In an embodiment, a single-stage folded-cascode buffer receives an input signal at an input terminal and provides an output signal at an output terminal. The amplifier has a first input terminal coupled the input of the single-stage folded-cascode buffer, and an output terminal coupled to the output terminal of the single-stage folded-cascode buffer. The first analog comparator has input terminals coupled to the input and output terminals of the amplifier, and an output terminal coupled to the first transistor, which has a terminal coupled to the output terminal of the single-stage folded-cascode buffer. The second analog comparator has input terminals coupled to the input and output terminals of the amplifier, and an output terminal coupled to the second transistor, which has a terminal coupled to the output terminal of the single-stage folded-cascode buffer.

During non-transient operating conditions, the first analog comparator biases the first transistor OFF, the second analog comparator biases the second transistor OFF, and the output signal of the single-stage folded-cascode buffer substantially equals the input signal. During a positive slewing transient on the input signal, the first analog comparator biases the first transistor ON to supply additional current to the output terminal of the single-stage folded-cascode buffer. During a negative slewing transient on the input signal, the second analog comparator biases the second transistor ON to sink additional current from the output terminal of the single-stage folded-cascode buffer. Without wanting to be bound by any particular theory, it is believed that the first and second analog comparators and the first and second transistors improve the slew rate of the single-stage folded-cascode buffer.

Figure 1A:
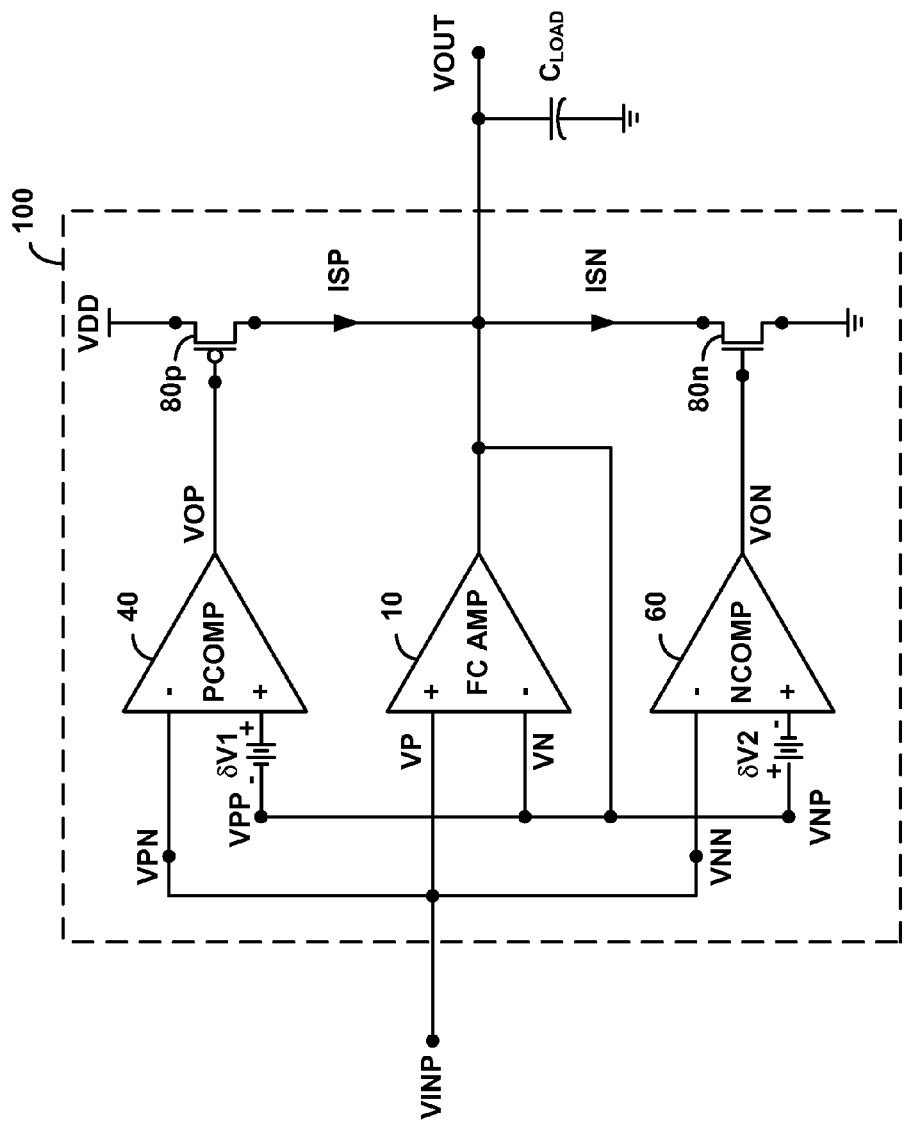
FIG. 1A is a high level block diagram of an embodiment of a single-stage folded cascode buffer amplifier with analog comparators.

FIG. 1A, is a block diagram of an example embodiment of a single-stage folded-cascode buffer 100 of this technology. Single-stage folded-cascode buffer 100 includes an amplifier 10, a first analog comparator 40, a second analog comparator 60, a first transistor 80$p$ and a second transistor 80$n$. First transistor 80$p$ and second transistor 80$n$ are both MOS transistors.

Amplifier 10 includes a first input terminal VP, a second input terminal VN, and an output terminal VOUT. In an embodiment, amplifier 10 is a single-stage folded cascode amplifier, with first input terminal VP coupled to input signal VINP, and output terminal VOUT coupled to second input terminal VN. In this regard, amplifier 10 is configured as a unity-gain buffer amplifier. Amplifier 10 is depicted driving a capacitive load $C_{LOAD}$ coupled to output terminal VOUT, although amplifier 10 may drive other types of loads.

First analog comparator 40 includes a first input terminal VPP coupled to second input terminal VN of amplifier 10, a second input terminal VPN coupled to first input terminal VP of amplifier 10, and an output terminal VOP. First analog comparator 40 has a first input-referred offset voltage $\delta V1$, depicted in FIG. 1A as a battery coupled to first input terminal VPP of first analog comparator 40. In some embodiments, first input-referred offset voltage $\delta V1$ may be between about 25 mV and about 50 mV, although other values may be used.

Second analog comparator 60 includes a first input terminal VNP coupled to second input terminal VN of amplifier 10, a second input terminal VNN coupled to first input terminal VP of amplifier 10, and an output terminal VON. Second analog comparator 60 has a second input-referred offset voltage $\delta V2$, depicted in FIG. 1A as a battery coupled to first input terminal VNP of second analog comparator 60. In some embodiments, second input-referred offset voltage $\delta V2$ may be between about 25 mV and about 50 mV, although other values may be used.

First transistor 80$p$ has a first terminal (e.g., a drain terminal), a second terminal (e.g., a gate terminal) and a third terminal (e.g., a source terminal). For simplicity, the first, second and third terminals of first transistor 80$p$ will be referred to as the drain terminal, gate terminal and source terminal, respectively. The drain terminal of first transistor 80$p$ is coupled to output terminal VOUT of amplifier 10, the gate terminal of first transistor 80$p$ is coupled to output terminal VOP of first analog comparator 40, and the source terminal of first transistor 80$p$ is coupled to a positive supply terminal VDD. First transistor 80$p$ conducts a first current ISP.

Second transistor 80$n$ has a first terminal (e.g., a drain terminal), a second terminal (e.g., a gate terminal) and a third terminal (e.g., a source terminal). For simplicity, the first, second and third terminals of second transistor 80$n$ will be referred to as the drain terminal, gate terminal and source terminal, respectively, of second transistor 80$n$. The drain terminal of second transistor 80$n$ is coupled to output terminal VOUT of amplifier 10, the gate terminal of second transistor 80$n$ is coupled to output terminal VON of second analog comparator 60, and the source terminal of second transistor 80$n$ is coupled to a negative supply terminal (e.g., GND). Second transistor 80$n$ conducts a second current ISN.

As described above, amplifier 10 is configured as a unity gain buffer, such that amplifier 10 regulates the output signal at output terminal VOUT to match input signal VINP at first input terminal VP. For simplicity, the output signal of amplifier 10 is referred to as VOUT. If input signal VINP is constant, or changes very slowly, amplifier 10 is able to regulate output signal VOUT such that VOUT is substantially equal to VINP. Under such circumstances, the signals at first input terminal VPP and second input terminal VPN of first analog comparator 40 are substantially equal, and the signals at first input terminal VNP and second input terminal VNN of second analog comparator 60 are substantially equal.

As a result of first input-referred offset voltage $\delta V1$ at first terminal VPP of first analog comparator 40, the output of first analog comparator 40 at output terminal VOP is VH (e.g., VH=VDD), and first transistor 80p is OFF. Thus, first transistor 80p is configured to be OFF when a difference between a voltage at first input terminal VP of amplifier 10 and a voltage at output terminal VOUT of amplifier 10 is less than a first predetermined value, δV1.

Likewise, as a result of second input-referred offset voltage δV2 at first terminal VNP of second analog comparator 60, the output of second analog comparator 60 at output terminal VON is VL (e.g., VL=GND), and first transistor 80n is OFF. Thus, second transistor 80n is configured to be OFF when a difference between a voltage at first input terminal VP of amplifier 10 and a voltage at output terminal VOUT of amplifier 10 is less than a second predetermined value, δV2.

In other words, for constant or very slowly changing input signals VINP, first transistor 80p and second transistor 80n are both OFF, and first current ISP and second current ISN are IL (e.g., IL=0).

If input signal VINP changes suddenly (e.g., if input signal VINP is a digital signal that transitions from VL to VH, or VH to VL), amplifier 10 may have limited output current capability to drive load $C_{LOAD}$, and hence output signal VOUT may lag input signal VINP. Under such circumstances, first transistor 80p and second transistor 80n may supply additional current to charge or discharge capacitive load $C_{LOAD}$, such that output signal VOUT may more quickly follow input signal VINP.

In particular, if input signal VINP suddenly increases, output signal VOUT will lag behind input signal VINP. If input signal VINP increases above output signal VOUT by more than first input-referred offset voltage δV1, output VOP of first analog comparator 40 will change from VH to VL, first transistor 80p will turn ON to supply a no-zero first current ISP to load $C_{LOAD}$, and output signal VOUT will increase to follow VINP. First transistor 80p remains ON and supplies first current ISP to load $C_{LOAD}$ as output signal VOUT increases. When the difference between output signal VOUT and input signal VINP is less than first input-referred offset voltage δV1, output VOP of first analog comparator 40 will change from VL to VH, first transistor 80p will turn OFF, and first current ISP drops to IL. In this regard, first transistor 80p is configured to turn ON and supply non-zero current ISP to load $C_{LOAD}$ in response to positive slewing transients on input signal VINP, and is otherwise effectively removed from the circuit.

Likewise, if input signal VINP suddenly decreases, output signal VOUT will lag behind input signal VINP. If input signal VINP decreases below output signal VOUT by more than second input-referred offset voltage δV2, output VON of second analog comparator 60 will change from VL to VH, second transistor 80n will turn ON to sink a non-zero second current ISP from load $C_{LOAD}$, and output signal VOUT will decrease to follow VINP. Second transistor 80n remains ON and sinks a non-zero second current ISN from load $C_{LOAD}$ as output signal VOUT decreases. When the difference between output signal VOUT and input signal VINP is less than second input-referred offset voltage δV2, output VON of second analog comparator 60 will change from VH to VL, second transistor 80n will turn OFF, and second current ISN drops to IL. In this regard, second transistor 80n is configured to turn ON and sink non-zero current ISN from load $C_{LOAD}$ in response to negative slewing transients on input signal VINP, and is otherwise effectively removed from the circuit.

Figure 1B:
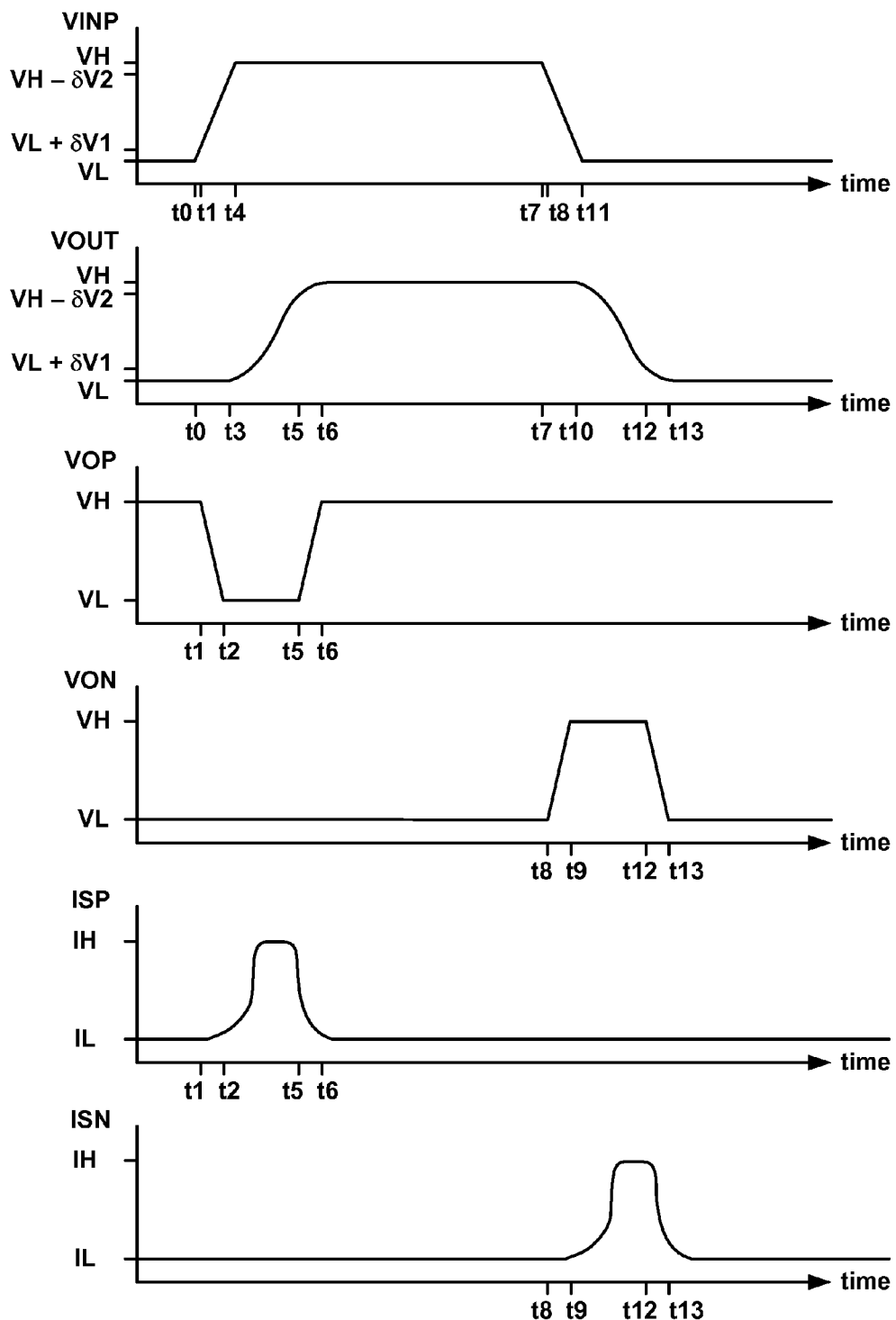
FIG. 1B is a diagram of various signals of the single-stage folded cascode buffer amplifier of FIG. 1A.

FIG. 1B illustrates examples of input signal VINP, output signal VOUT, first analog comparator 40 output signal VOP, second analog comparator 60 output signal VON, first current ISP and second current ISN during positive and negative slewing transients. Prior to time t0, input signal VINP=VL, output signal VOUT=VL, first analog comparator 40 output signal VOP=VH, second analog comparator 60 outputs signal VON=VL, first current ISP=IL and second current ISN=IL.

At time t0, input signal VINP begins to increase from VL to VH, but output signal VOUT remains at VL. At time t1, input signal VINP increases above VL+δV1, but output signal VOUT remains at about VL. As a result, between t1 and t2, first analog comparator 40 output signal VOP switches from VH to VL as input signal VINP continues to increase above output signal VOUT. As VOP switches from VH to VL, first transistor 80p turns ON, and first current ISP begins to increase towards IH.

Accordingly, at t3, output signal VOUT begins to increase above VL, and input signal VINP continues to increase. Because VINP>(VOUT+δV1), first analog comparator 40 output signal VOP remains at VL, first transistor 80p remains ON, first current ISP continues to increase and charge load $C_{LOAD}$ and output signal VOUT continues to increase.

At t4, input signal VINP=VH, VINP>(VOUT+δV1), first analog comparator 40 output signal VOP remains at VL, first transistor 80p remains ON, first current ISP continues to increase and charge load $C_{LOAD}$, and output signal VOUT continues to increase.

Between t4 and t5, output signal continues to increase towards VH. At t5, input signal VINP=VH, output signal VOUT increases above (VH−δV1), and thus (VOUT+δV1)>VINP. As a result, between t5 and t6, first analog comparator 40 output signal VOP switches from VL to VH, first transistor 80p begins to turn OFF, first current ISP begins to decrease, but continues to charge load $C_{LOAD}$ through the main amplifier and output signal VOUT continues to increase.

At t6, input signal VINP=VH, output signal VOUT=VH, first analog comparator 40 output signal VOP=VH, first transistor 80p is OFF, and first current ISP=IL. Thus, during a positive slewing transition on input signal VINP, first transistor 80p turns ON to supply non-zero first ISP to charge load $C_{LOAD}$, and to increase output signal VOUT. After the transient event, once output signal VOUT substantially equals input signal VINP, first transistor 80p turns OFF and is effectively removed from the circuit.

At time t7, input signal VINP begins to decrease from VL to VH, but output signal VOUT remains at VH. At time t8, input signal VINP decreases below VH−δV2, but output signal VOUT remains at about VH. As a result, between t8 and t9, second analog comparator 60 output signal VON switches from VL to VH as input signal VINP continues to decrease below output signal VOUT. As VON switches from VL to VH, second transistor 80n turns ON, and second current ISN begins to increase towards IH to discharge load $C_{LOAD}$.

Accordingly, at t10, output signal VOUT begins to decrease below VH, and input signal VINP continues to decrease. Because VINP>(VOUT+δV2), second analog comparator 60 output signal VON remains at VH, second transistor 80n remains ON, second current ISN continues to increase and discharge load $C_{LOAD}$ and output signal VOUT continues to decrease.

At t11, input signal VINP=VL, VINP>(VOUT+δV2), second analog comparator 60 output signal VON remains at VH, second transistor 80n remains ON, second current ISN continues to increase and discharge load $C_{LOAD}$ and output signal VOUT continues to decrease.

Between t11 and t12, output signal continues to decrease towards VL. At t12, input signal VINP=VL, output signal VOUT decreases below (VL+δV2), and thus (VOUT+δV2)>VINP. As a result, between t12 and t13, second analog comparator 60 output signal VON switches from VH to VL, second transistor 80*n* begins to turn OFF, second current ISN begins to decrease, but continues to discharge load $C_{LOAD}$ through the main amplifier and output signal VOUT continues to decrease.

At t13, input signal VINP=VL, output signal VOUT=VL, second analog comparator 60 output signal VON=VLH, second transistor 80*n* is OFF, and second current ISN=IL. Thus, during a negative slewing transition on input signal VINP, second transistor 80*n* turns ON to sink non-zero first current ISN to discharge load $C_{LOAD}$, and to decrease output signal VOUT. After the transient event, once output signal VOUT substantially equals input signal VINP, second transistor 80*n* turns OFF and is effectively removed from the circuit.

Persons of ordinary skill in the art will understand that first input-referred offset voltage δV1 and second input-referred offset voltage δV2 may have the same value, or may have different values, and may be selected to achieve a desired voltage differential at which first transistor 80*p* and second transistor 80*n* turn ON and supply additional current during positive and negative slewing transients.

Figure 2:
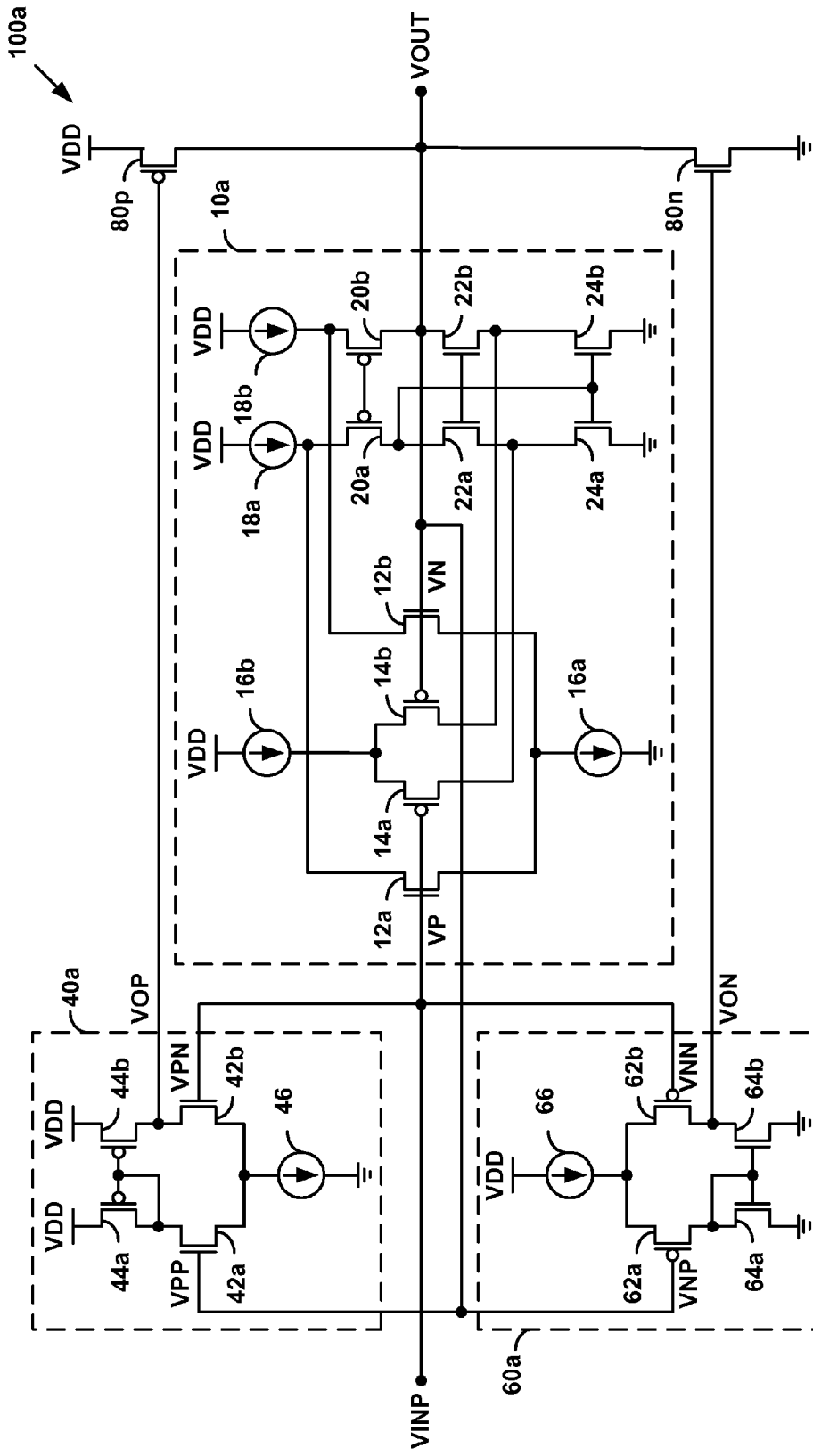
FIG. 2 is a schematic diagram of an example embodiment of the single-stage folded cascode amplifier of FIG. 1A.

FIG. 2 illustrates a schematic diagram of an embodiment of the single-stage folded-cascode buffer 100 of FIG. 1A. In particular, FIG. 2 illustrates a schematic diagram of single-stage folded-cascode buffer 100*a*, which includes amplifier 10*a*, first analog comparator 40*a* and second analog comparator 60*a*.

Amplifier 10*a* includes a first input differential pair that includes n-MOS transistors 12*a* and 12*b*, a second input differential pair that includes p-MOS transistors 14*a* and 14*b*, current sources 16*a* and 16*b*, and a cascode output stage that includes current sources 18*a* and 18*b*, p-MOS transistors 20*a* and 20*b*, and n-MOS transistors 22*a*, 22*b*, 24*a* and 24*b*.

N-MOS transistor 12*a* includes a first (drain) terminal coupled to first terminal of current source 18*a*, a second (gate) terminal coupled to first input terminal VP of amplifier 10*a*, and a third (source) terminal coupled to a first terminal of current source 16*a*. N-MOS transistor 12*b* includes a first (drain) terminal coupled to first terminal of current source 18*b*, a second (gate) terminal coupled to second input terminal VN of amplifier 10*a*, and a third (source) terminal coupled to the first terminal of current source 16*a*. Current sources 18*a* and 18*b* each have a second terminal coupled to a positive supply VDD, and current source 16*a* has a second terminal coupled to a negative supply (e.g., GND).

P-MOS transistor 14*a* includes a first (drain) terminal, a second (gate) terminal coupled to first input terminal VP of amplifier 10*a*, and a third (source) terminal coupled to a first terminal of current source 16*b*. P-MOS transistor 14*b* includes a first (drain) terminal, a second (gate) terminal coupled to second input terminal VN of amplifier 10*a*, and a third (source) terminal coupled to the first terminal of current source 16*b*. Current source 16*b* has a second terminal coupled to positive supply VDD.

P-MOS transistor 20*a* includes a first (drain) terminal, a second (gate) terminal, and a third (source) terminal coupled to the drain terminal of p-MOS transistor 12*a* and the first terminal of current source 18*a*. P-MOS transistor 20*b* includes a first (drain) terminal, a second (gate) terminal coupled to the gate terminal of p-MOS transistor 20*a*, and a third (source) terminal coupled to the drain terminal of p-MOS transistor 12*b* and the first terminal of current source 18*b*.

N-MOS transistor 22*a* includes a first (drain) terminal coupled to the drain terminal of p-MOS transistor 20*a*, a second (gate) terminal, and a third (source) terminal coupled to the drain terminal of p-MOS transistor 14*a*. N-MOS transistor 22*b* includes a first (drain) terminal coupled to output terminal VOUT and the drain terminal of p-MOS transistor 20*b*, a second (gate) terminal coupled to the gate terminal of n-MOS transistor 22*a*, and a third (source) terminal coupled to the drain terminal of p-MOS transistor 14*b*.

N-MOS transistor 24*a* includes a first (drain) terminal coupled to the drain terminal of p-MOS transistor 14*a* and the source terminal of n-MOS transistor 22*a*, a second (gate) terminal coupled to the drain terminal of p-MOS transistor 20*a* and the drain terminal of n-MOS transistor 22*a*, and a third (source) terminal coupled to GND. N-MOS transistor 24*b* includes a first (drain) terminal coupled to the drain terminal of p-MOS transistor 14*b* and the source terminal of n-MOS transistor 22*b*, a second (gate) terminal coupled to the gate terminal of n-MOS transistor 24*a*, the drain terminal of p-MOS transistor 20*a* and the drain terminal of n-MOS transistor 22*a*, and a third (source) terminal coupled to GND.

First analog comparator 40*a* includes a third input differential pair that includes n-MOS transistors 42*a* and 42*b*, a current source 46, and a first load stage that includes p-MOS transistors 44*a* and 44*b*.

N-MOS transistor 42*a* includes a first (drain) terminal, a second (gate) terminal coupled to first input terminal VPP of first analog comparator 40*a*, and a third (source) terminal coupled to a first terminal of current source 46, which has a second terminal coupled to GND. N-MOS transistor 42*b* includes a first (drain) terminal coupled to output terminal VOP of first analog comparator 40*a* and the gate terminal of first transistor 80*p*, a second (gate) terminal coupled to second input terminal VPN of first analog comparator 40*a*, and a third (source) terminal coupled to the first terminal of current source 46.

P-MOS transistor 44*a* includes a first (drain) terminal coupled to the drain terminal of n-MOS transistor 42*a*, a second (gate) terminal coupled to the drain terminal of p-MOS transistor 44*a* and the drain terminal of n-MOS transistor 42*a*, and a third (source) terminal coupled to VDD. P-MOS transistor 44*b* includes a first (drain) terminal coupled to output terminal VOP of first analog comparator 40*a*, the drain terminal of n-MOS transistor 42*b* and the gate terminal of first transistor 80*p*, a second (gate) terminal coupled to the gate and drain terminals of p-MOS transistor 44*a* and the drain terminal of n-MOS transistor 42*a*, and a third (source) terminal coupled to VDD.

As described above, first analog comparator 40*a* has a first input-referred offset voltage δV1. In an embodiment, n-MOS transistors 42*a* and 42*b* of third input differential pair may be sized differently to create first input-referred offset voltage δV1. In particular, n-MOS transistor 42*a* may have a first width W1, n-MOS transistor 42*b* may have a second width W2, and first width W1 may be made larger than second width W2 to obtain a desired first input-referred offset voltage δV1:

$$\delta V1 = VINP \times \left( \sqrt{\frac{W1}{W2}} - 1 \right)$$

In particular, if the signals at first input terminal VPP and second input terminal VPN of first analog comparator 40*a* are equal, n-MOS transistors 42*a* and 42*b* have equal gate-to-source voltages. Because first width W1 is greater than second width W2, n-MOS transistor 42*a* can sink more current than n-MOS transistor 42*b*. As a result, if the signals at first input terminal VPP and second input terminal VPN of first analog comparator 40*a* are equal, output signal VOP of first analog comparator 40*a* is pulled HIGH towards VDD. Thus, in a non-slewing operating condition, output signal VOP of first analog comparator 40a is HIGH, and first transistor 80p is OFF.

During a positive slewing transient, if input signal VINP (which is coupled to second input terminal VPN of first analog comparator 40a) increases above output signal VOUT (which is coupled to first input terminal VPP of first analog comparator 40a) by more than first input-referred offset voltage δV1, n-MOS transistor 42b sinks more current than n-MOS transistor 42a, and output signal VOP of first analog comparator 40a is pulled toward GND, turning ON first transistor 80p.

Second analog comparator 60a includes a fourth input differential pair that includes p-MOS transistors 62a and 62b, a current source 66, and a second load stage that includes n-MOS transistors 64a and 64b.

P-MOS transistor 62a includes a first (drain) terminal, a second (gate) terminal coupled to first input terminal VNP of second analog comparator 60a, and a third (source) terminal coupled to a first terminal of current source 66, which has a second terminal coupled to VDD. P-MOS transistor 62b includes a first (drain) terminal coupled to output terminal VON of second analog comparator 60a and the gate terminal of second transistor 80n, a second (gate) terminal coupled to second input terminal VNN of second analog comparator 60a, and a third (source) terminal coupled to the first terminal of current source 66.

N-MOS transistor 64a includes a first (drain) terminal coupled to the drain terminal of p-MOS transistor 62a, a second (gate) terminal coupled to the drain terminal of n-MOS transistor 64a and the drain terminal of p-MOS transistor 62a, and a third (source) terminal coupled to GND. N-MOS transistor 64b includes a first (drain) terminal coupled to output terminal VON of second analog comparator 60a, the drain terminal of p-MOS transistor 62b and the gate terminal of second transistor 80n, a second (gate) terminal coupled to the gate and drain terminals of n-MOS transistor 64a and the drain terminal of p-MOS transistor 62a, and a third (source) terminal coupled to GND.

As described above, second analog comparator 60a has a second input-referred offset voltage δV2. In an embodiment, p-MOS transistors 62a and 62b of fourth input differential pair may be sized differently to create second input-referred offset voltage δV2. In particular, p-MOS transistor 62a may have a third width W3, p-MOS transistor 62b may have a fourth width W4, and third width W3 may be made larger than fourth width W4 to obtain a desired second input-referred offset voltage δV2:

$$\delta V2 = VINP \times \left( \sqrt{\frac{W3}{W4}} - 1 \right)$$

In particular, if the signals at first input terminal VNP and second input terminal VNN of second analog comparator 60a are equal, p-MOS transistors 62a and 62b have equal gate-to-source voltages. Because third width W3 is greater than fourth width W4, p-MOS transistor 62a can sink more current than p-MOS transistor 62b. As a result, if the signals at first input terminal VNP and second input terminal VNN of second analog comparator 60a are equal, output signal VON of second analog comparator 60a is pulled LOW towards GND. Thus, in a non-slewing operating condition, output signal VON of second analog comparator 60a is LOW, and second transistor 80n is OFF.

During a negative slewing transient, if input signal VINP (which is coupled to second input terminal VNN of second analog comparator 60a) decreases below output signal VOUT (which is coupled to first input terminal VNP of second analog comparator 60a) by more than second input-referred offset voltage δV2, p-MOS transistor 62b sinks more current than p-MOS transistor 62a, and output signal VON of second analog comparator 60a is pulled toward VDD, turning ON second transistor 80n.

Figure 3:
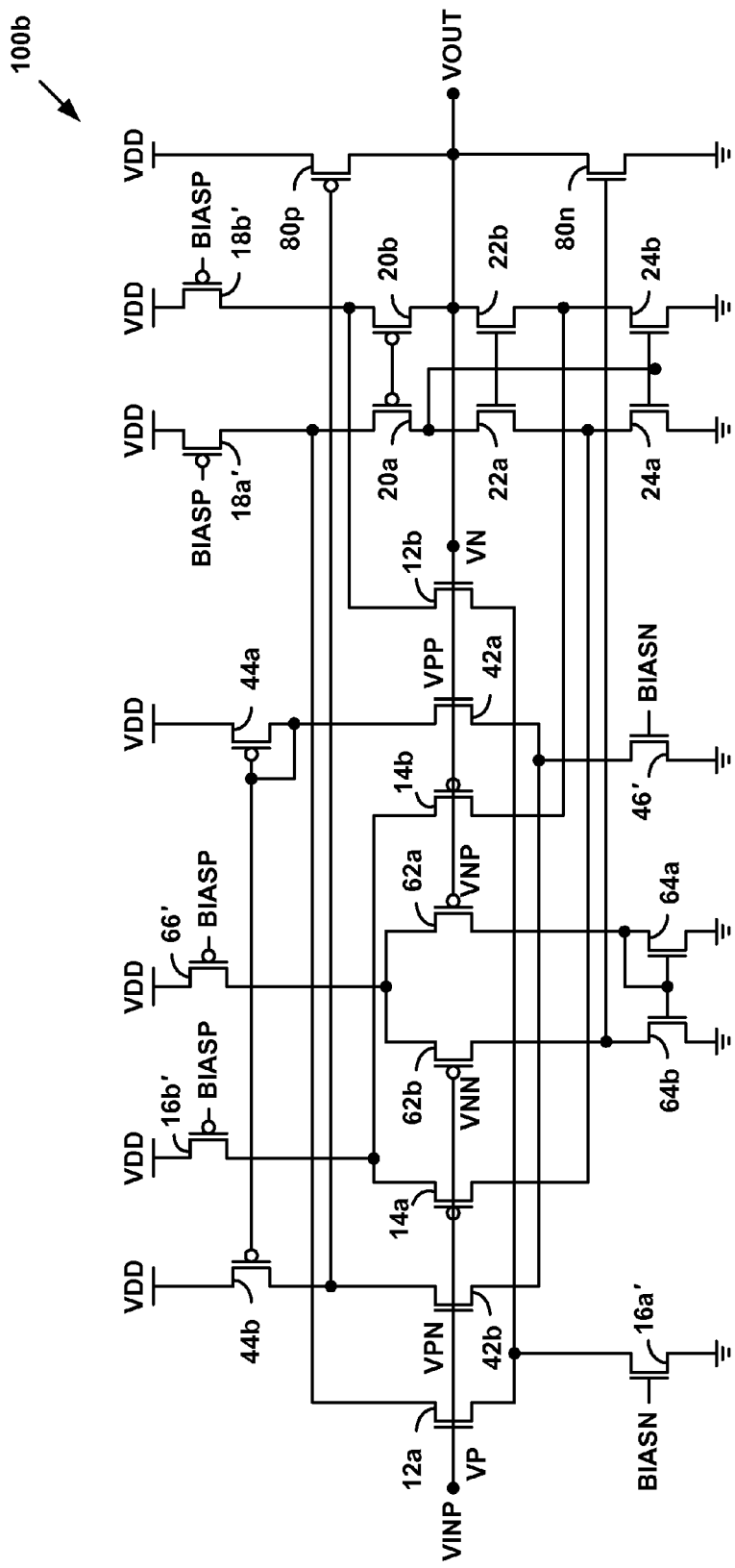
FIG. 3 is a schematic diagram of an example embodiment of the single-stage folded cascode amplifier of FIG. 1A.

FIG. 3 illustrates a schematic diagram of another embodiment of the single-stage folded-cascode buffer 100 of FIG. 1A. In particular, FIG. 3 illustrates a schematic diagram of single-stage folded-cascode buffer 100b, which includes the same transistors as single-stage folded-cascode buffer 100a of FIG. 2, but in a slightly different configuration. In addition, in the embodiment of FIG. 3, current sources 16a and 46 of single-stage folded-cascode buffer 100a are implemented in single-stage folded-cascode buffer 100b as n-MOS transistors 16a' and 46', respectively, each having a gate terminal coupled to a bias terminal BIASN. Similarly, current sources 16b, 18a, 18b and 66 of single-stage folded-cascode buffer 100a are implemented in single-stage folded-cascode buffer 100b as p-MOS transistors 16b' 18a', 18b' and 66', respectively, each having a gate terminal coupled to a bias terminal BIASP. Persons of ordinary skill in the art will understand that separate bias terminals may be used for each of n-MOS transistors 16a' and 46', and each of p-MOS transistors 16b' 18a', 18b' and 66'.

One embodiment of the disclosed technology includes a single-stage folded cascode buffer including an amplifier, a first analog comparator, a second analog comparator, a first transistor, and a second transistor, The amplifier includes a first input terminal, a second input terminal, and an output terminal coupled to the second input terminal of the amplifier. The first analog comparator includes a first input terminal coupled to the second input terminal of the amplifier, a second input terminal coupled to the first input terminal of the amplifier, and an output terminal. The second analog comparator includes a first input terminal coupled to the second input terminal of the amplifier, a second input terminal coupled to the first input terminal of the amplifier, and an output terminal. The first transistor includes a first terminal coupled to a positive supply terminal, a second terminal coupled to the output terminal of the first analog comparator, and a third terminal coupled to the output terminal of the amplifier. The second transistor includes a first terminal coupled to the output terminal of the amplifier, a second terminal coupled to the output terminal of the second analog comparator, and a third terminal coupled to a negative supply terminal.

One embodiment of the disclosed technology includes a single-stage folded cascode buffer that includes an amplifier, a first analog comparator, a second analog comparator, a first transistor and a second transistor. The amplifier includes a first input terminal, a second input terminal, an output terminal, a first input differential pair, a second input differential pair, and a cascode output stage, the first input differential pair and the second input differential pair coupled to the first input terminal and the second input terminal of the amplifier, the cascode output stage coupled to the first input differential pair, the second input differential pair, and the output terminal of the amplifier, which is coupled to the second input terminal of the amplifier. The first analog comparator includes a first input terminal, a second input terminal, an output terminal, a third input differential pair, and a load stage, the third input differential pair coupled to the first input terminal and the second input terminal of the first analog comparator, and the first input terminal and the second input terminal of the amplifier, and the load stage coupled to the third input differential pair and the output terminal of the first analog comparator. The second analog comparator includes a first input terminal, a second input terminal, an output terminal, a fourth input differential pair, and a load stage, the fourth input differential pair coupled to the first input terminal and the second input terminal of the second analog comparator, and the first input terminal and the second input terminal of the amplifier, and the load stage coupled to the fourth input differential pair and the output terminal of the second analog comparator The first transistor includes a first terminal coupled to a positive supply terminal, a second terminal coupled to the output terminal of the first analog comparator, and a third terminal coupled to the output terminal of the amplifier. The second transistor includes a first terminal coupled to the output terminal of the amplifier, a second terminal coupled to the output terminal of the second analog comparator, and a third terminal coupled to a negative supply terminal.

One embodiment of the disclosed technology includes a method for providing a single-stage folded cascode buffer. The method includes providing an amplifier having a first input terminal, a second input terminal, and an output terminal, wherein the amplifier comprises a single-stage folded cascode amplifier, providing a first analog comparator comprising a first input terminal, a second input terminal and an output terminal, providing a second analog comparator comprising a first input terminal, a second input terminal and an output terminal, providing a first transistor comprising a first terminal, a second terminal and a third terminal, providing a second transistor comprising a first terminal, a second terminal and a third terminal, coupling the output terminal of the amplifier to the second input terminal of the amplifier, coupling the first input terminal of the first analog comparator and the first input terminal of the second analog comparator to the second input terminal of the amplifier, coupling the second input terminal of the first analog comparator and the second input terminal of the second analog comparator to the first input terminal of the amplifier, coupling the first terminal of the first transistor to a positive supply terminal, coupling the second terminal of the first transistor to the output terminal of the first analog comparator, and coupling the third terminal of the first transistor to the output terminal of the amplifier, and coupling the first terminal of the second transistor to the output terminal of the amplifier, coupling the second terminal of the second transistor to the output terminal of the second analog comparator, and coupling the third terminal of the second transistor to a negative supply terminal.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A single-stage folded cascode buffer comprising:
an amplifier having a first input terminal, a second input terminal, and an output terminal coupled to the second input terminal of the amplifier;
a first analog comparator comprising a first input terminal coupled to the second input terminal of the amplifier, a second input terminal coupled to the first input terminal of the amplifier, and an output terminal;
a second analog comparator comprising a first input terminal coupled to the second input terminal of the amplifier, a second input terminal coupled to the first input terminal of the amplifier, and an output terminal;
a first transistor comprising a first terminal coupled to a positive supply terminal, a second terminal coupled to the output terminal of the first analog comparator, and a third terminal coupled to the output terminal of the amplifier; and
a second transistor comprising a first terminal coupled to the output terminal of the amplifier, a second terminal coupled to the output terminal of the second analog comparator, and a third terminal coupled to a negative supply terminal.

2. The single-stage folded cascode buffer of claim 1, wherein the amplifier comprises a single-stage folded cascode amplifier.

3. The single-stage folded cascode buffer of claim 1, wherein the first analog comparator comprises a first input-referred offset voltage $\delta V1$.

4. The single-stage folded cascode buffer of claim 3, wherein the first input-referred offset voltage $\delta V1$ is between about 25 mV and about 50 mV.

5. The single-stage folded cascode buffer of claim 1, wherein the second analog comparator comprises a second input-referred offset voltage $\delta V2$.

6. The single-stage folded cascode buffer of claim 5, wherein the second input-referred offset voltage $\delta V2$ is between about 25 mV and about 50 mV.

7. The single-stage folded cascode buffer of claim 1, wherein the first transistor is configured to turn ON in response to a positive slewing transient on the first input terminal of the amplifier.

8. The single-stage folded cascode buffer of claim 1, wherein the first transistor is configured to be OFF when a difference between a voltage at the first input terminal of the amplifier and a voltage at the output terminal of the amplifier is less than a first predetermined value.

9. The single-stage folded cascode buffer of claim 1, wherein the second transistor is configured to turn ON in response to a negative slewing transient on the first input terminal of the amplifier.

10. The single-stage folded cascode buffer of claim 1, wherein the second transistor is configured to be OFF when a difference between a voltage at the first input terminal of the amplifier and a voltage at the output terminal of the amplifier is less than a second predetermined value.

11. A single-stage folded cascode buffer comprising:
an amplifier comprising a first input terminal, a second input terminal, an output terminal, a first input differential pair, a second input differential pair, and a cascode output stage, the first input differential pair and the second input differential pair coupled to the first input terminal and the second input terminal of the amplifier, the cascode output stage coupled to the first input differential pair, the second input differential pair, and the output terminal of the amplifier, which is coupled to the second input terminal of the amplifier;

a first analog comparator comprising a first input terminal, a second input terminal, an output terminal, a third input differential pair, and a first load stage, the third input differential pair coupled to the first input terminal and the second input terminal of the first analog comparator, and the first input terminal and the second input terminal of the amplifier, and the first load stage coupled to the third input differential pair and the output terminal of the first analog comparator;

a second analog comparator comprising a first input terminal, a second input terminal, an output terminal, a fourth input differential pair, and a second load stage, the fourth input differential pair coupled to the first input terminal and the second input terminal of the second analog comparator, and the first input terminal and the second input terminal of the amplifier, and the second load stage coupled to the fourth input differential pair and the output terminal of the second analog comparator;

a first transistor comprising a first terminal coupled to a positive supply terminal, a second terminal coupled to the output terminal of the first analog comparator, and a third terminal coupled to the output terminal of the amplifier; and a second transistor comprising a first terminal coupled to the output terminal of the amplifier, a second terminal coupled to the output terminal of the second analog comparator, and a third terminal coupled to a negative supply terminal.

12. The single-stage folded cascode buffer of claim 11, wherein the first analog comparator comprises a first input-referred offset voltage $\delta V1$.

13. The single-stage folded cascode buffer of claim 12, wherein the first input-referred offset voltage $\delta V1$ is between about 25 mV and about 50 mV.

14. The single-stage folded cascode buffer of claim 11, wherein the second analog comparator comprises a second input-referred offset voltage $\delta V2$.

15. The single-stage folded cascode buffer of claim 14, wherein the second input-referred offset voltage $\delta V2$ is between about 25 mV and about 50 mV.

16. The single-stage folded cascode buffer of claim 11, wherein the first transistor is configured to turn ON in response to a positive slewing transient on the first input terminal of the amplifier.

17. The single-stage folded cascode buffer of claim 11, wherein the first transistor is configured to be OFF when a difference between a voltage at the first input terminal of the amplifier and a voltage at the output terminal of the amplifier is less than a first predetermined value.

18. The single-stage folded cascode buffer of claim 11, wherein the second transistor is configured to turn ON in response to a negative slewing transient on the first input terminal of the amplifier.

19. The single-stage folded cascode buffer of claim 11, wherein the second transistor is configured to be OFF when a difference between a voltage at the first input terminal of the amplifier and a voltage at the output terminal of the amplifier is less than a second predetermined value.

20. A method for providing a single-stage folded cascode buffer, the method comprising:
providing an amplifier having a first input terminal, a second input terminal, and an output terminal, wherein the amplifier comprises a single-stage folded cascode amplifier;
providing a first analog comparator comprising a first input terminal, a second input terminal and an output terminal;
providing a second analog comparator comprising a first input terminal, a second input terminal and an output terminal;
providing a first transistor comprising a first terminal, a second terminal and a third terminal;
providing a second transistor comprising a first terminal, a second terminal and a third terminal;
coupling the output terminal of the amplifier to the second input terminal of the amplifier;
coupling the first input terminal of the first analog comparator and the first input terminal of the second analog comparator to the second input terminal of the amplifier;
coupling the second input terminal of the first analog comparator and the second input terminal of the second analog comparator to the first input terminal of the amplifier;
coupling the first terminal of the first transistor to a positive supply terminal, coupling the second terminal of the first transistor to the output terminal of the first analog comparator, and coupling the third terminal of the first transistor to the output terminal of the amplifier; and
coupling the first terminal of the second transistor to the output terminal of the amplifier, coupling the second terminal of the second transistor to the output terminal of the second analog comparator, and coupling the third terminal of the second transistor to a negative supply terminal.

21. The method of claim 20, wherein the first analog comparator comprises a first input-referred offset voltage $\delta V1$.

22. The method of claim 21, wherein the first input-referred offset voltage $\delta V1$ is between about 25 mV and about 50 mV.

23. The method of claim 20, wherein the second analog comparator comprises a second input-referred offset voltage $\delta V2$.

24. The method of claim 23, wherein the second input-referred offset voltage $\delta V2$ is between about 25 mV and about 50 mV.

25. The method of claim 20, further comprising turning ON the first transistor in response to a positive slewing transient on the first input terminal of the amplifier.

26. The method of claim 20, further comprising keeping the first transistor OFF when a difference between a voltage at the first input terminal of the amplifier and a voltage at the output terminal of the amplifier is less than a first predetermined value.

27. The method of claim 20, further comprising turning ON the second transistor in response to a negative slewing transient on the first input terminal of the amplifier.

28. The method of claim 20, further comprising keeping the second transistor OFF when a difference between a voltage at the first input terminal of the amplifier and a voltage at the output terminal of the amplifier is less than a second predetermined value.

* * * * *